(12) United States Patent
Kitamoto (10) Patent No.: US 9,956,989 B2
(45) Date of Patent: May 1, 2018

(54) INVERTER, MOTOR CONTROL APPARATUS, AND POWER STEERING SYSTEM

(71) Applicant: JTEKT CORPORATION, Osaka-shi, Osaka (JP)

(72) Inventor: Hiroshi Kitamoto, Toyota (JP)

(73) Assignee: JTEKT CORPORATION, Osaka (JP)

( * ) Notice: Subject to any disclaimer, the term of this patent is extended or adjusted under 35 U.S.C. 154(b) by 0 days. days.

(21) Appl. No.: 15/433,363

(22) Filed: Feb. 15, 2017

(65) Prior Publication Data
US 2017/0240200 A1    Aug. 24, 2017

(30) Foreign Application Priority Data

Feb. 24, 2016    (JP) .................. 2016-032742

(51) Int. Cl.
| | |
|---|---|
| H02P 27/04 | (2016.01) |
| H03G 1/00 | (2006.01) |
| B62D 5/04 | (2006.01) |
| H02M 7/537 | (2006.01) |
| H02P 27/08 | (2006.01) |
| H02P 6/17 | (2016.01) |
| H02P 29/024 | (2016.01) |

(52) U.S. Cl.
CPC .......... B62D 5/046 (2013.01); H02M 7/537 (2013.01); H02P 6/17 (2016.02); H02P 27/08 (2013.01); H02P 29/024 (2013.01)

(58) Field of Classification Search
USPC .......................................... 319/489; 363/131
See application file for complete search history.

(56) References Cited

U.S. PATENT DOCUMENTS

| | | | | |
|---|---|---|---|---|
| 3,725,822 A | * | 4/1973 | Eaton, Jr. ............... | H03B 5/364 331/108 A |
| 4,110,704 A | * | 8/1978 | Irwin ..................... | H03K 3/03 331/111 |
| 5,446,346 A | * | 8/1995 | Nilssen ............. | H02M 7/53832 315/209 R |

(Continued)

FOREIGN PATENT DOCUMENTS

| | | |
|---|---|---|
| EP | 2573893 A2 | 3/2013 |
| JP | 2005051668 A | 2/2005 |

(Continued)

OTHER PUBLICATIONS

May 17, 2017 Extended Search Report issued with European Patent Application No. 17157233.2.

Primary Examiner — Bentsu Ro
(74) Attorney, Agent, or Firm — Oliff PLC (57) ABSTRACT

An inverter includes a positive electrode terminal and a negative electrode terminal, upper-arm switching elements and lower-arm switching elements, and a voltage divider that supplies partial voltages of a voltage between the positive electrode terminal and the negative electrode terminal to a gate and a drain, respectively, of the lower-arm switching element. The lower-arm switching element includes an HEMT. In the voltage divider, the partial voltages are set to turn the lower-arm switching element off when a positive electrode and a negative electrode of a DC power supply are reversely connected to the positive electrode terminal and the negative electrode terminal, respectively.

7 Claims, 8 Drawing Sheets

(56) References Cited

U.S. PATENT DOCUMENTS

| | | | |
|---|---|---|---|
| 6,518,799 B2* | 2/2003 | Yoshida | H03K 5/08 327/77 |
| 7,027,276 B2* | 4/2006 | Chen | H02H 9/046 361/56 |
| 2010/0109588 A1 | 5/2010 | Koike | |
| 2010/0327709 A1 | 12/2010 | Minato et al. | |

FOREIGN PATENT DOCUMENTS

| JP | 2010-114957 A | 5/2010 |
|---|---|---|
| JP | 2015012624 A | 1/2015 |

* cited by examiner

INVERTER, MOTOR CONTROL APPARATUS, AND POWER STEERING SYSTEM

INCORPORATION BY REFERENCE

The disclosure of Japanese Patent Application No. 2016-032742 filed on Feb. 24, 2016 including the specification, drawings and abstract, is incorporated herein by reference in its entirety.

BACKGROUND OF THE INVENTION

1. Field of the Invention

The invention relates to an inverter, a motor control apparatus, and a power steering system using the motor control apparatus.

2. Description of the Related Art

A power steering system performs steering assistance by transmitting a driving force of a motor to a steering shaft. An inverter is used to control such a motor. The inverter includes a bridge circuit having a plurality of sets each of an upper arm and a lower arm connected together in series between a positive electrode and a negative electrode of a DC power supply such that the sets are connected together in parallel. A middle point between the upper and lower arms of each set in the inverter is connected to a corresponding phase coil of the motor. The upper arm and the lower arm each include a switching element. The switching elements are controllably turned on and off in accordance with control signals. On-off actions of the switching elements allow phase voltages to be supplied to the corresponding phase coils of the motor. The motor is thus rotated to generate a driving force.

As the DC power supply, for example, a replaceable battery is used. When replacing the battery, a user may erroneously connect the positive electrode and the negative electrode of the battery to a negative electrode side and a positive electrode side, respectively, of the inverter. Thus, measures are taken to allow no current to flow through the inverter if the positive electrode and negative electrode of the battery are connected to the negative electrode side and positive electrode side, respectively of the inverter.

In an example of such a measure to prevent back-flow, a mechanical relay is inserted between the inverter and the DC power supply. In this case, when the DC power supply is reversely connected, the mechanical relay makes the circuit between the inverter and the DC power supply open. Alternatively, a diode or an FET may be inserted between the inverter and the DC power supply to allow no current to flow when the DC power supply is reversely connected.

By way of example, Japanese Patent Application Publication No. 2010-114957 (JP 2010-114957 A) discloses a configuration in which a MOSFET for interruption in a non-use state is connected in series between the positive electrode of the DC power supply and the inverter. When the positive electrode and negative electrode of the DC power supply are connected to the negative electrode side and positive electrode side, respectively, of the inverter, output from the reversely connected DC power supply keeps the MOSFET for interruption in the non-use state off. This allows prevention of a possible short circuit between the terminals of the DC power supply when the DC power supply is reversely connected.

The insertion of the mechanical relay as in the above-described related art may lead to an increased size of the apparatus. The insertion of the diode or FET may increase a resistance component of a current path (for example, a voltage drop in the case of the diode). This may increase losses to the apparatus.

SUMMARY OF THE INVENTION

An object of the invention is to provide an inverter configured differently from conventional inverters and allowing measures to be taken when a DC power supply is reversely connected, a motor control apparatus including the inverter, and a power steering system including the motor control apparatus.

An inverter in an aspect of the invention includes a positive electrode terminal and a negative electrode terminal to which a positive electrode and a negative electrode, respectively, of a DC power supply are connected, an upper-arm switching element and a lower-arm switching element connected in series between the positive electrode terminal and the negative electrode terminal, and a voltage divider connected between the positive electrode terminal and the negative electrode terminal to supply partial voltages of a voltage between the positive electrode terminal and the negative electrode terminal to a gate and a drain, respectively, of the lower-arm switching element.

The lower-arm switching element includes a high electron mobility transistor. In the voltage divider, the partial voltages are set to turn the lower-arm switching element off when the DC power supply is reversely connected in a manner that the positive electrode of the DC power supply is connected to the negative electrode terminal, while the negative electrode of the DC power supply is connected to the positive electrode terminal.

The inverter in the above-described aspect is configured differently from the conventional inverters to enable measures to be taken when the DC power supply is reversely connected.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

An inverter according to an embodiment includes a positive electrode terminal and a negative electrode terminal to which a positive electrode and a negative electrode, respectively, of a DC power supply are connected, an upper-arm switching element and a lower-arm switching element connected in series between the positive electrode terminal and the negative electrode terminal, and a voltage divider connected between the positive electrode terminal and the negative electrode terminal to supply partial voltages of a voltage between the positive electrode terminal and the negative electrode terminal to a gate and a drain, respectively, of the lower-arm switching element. The lower-arm switching element includes a high electron mobility transistor (HEMT). In the voltage divider, the partial voltages are set to turn the lower-arm switching element off when the DC power supply is reversely connected such that the positive electrode of the DC power supply is connected to the negative electrode terminal, while the negative electrode of the DC power supply is connected to the positive electrode terminal (this state is hereinafter simply expressed as "reversely connected" or "reverse connection") (first configuration).

In the first configuration, the lower-arm switching element includes an HEMT and is thus free from a parasitic diode (also referred to as a built-in diode or a body diode). Thus, if the DC power supply is reversely connected, no current resulting from a parasitic diode flows. That is, if the DC power supply is reversely connected, no current flows when the lower-arm switching element is off. The voltage divider supplies the partial voltages of the voltage between the positive electrode and negative electrode terminals to the gate and the drain, respectively, of the lower-arm switching element. The partial voltages from the voltage divider are set to allow the voltage of the DC power supply to turn the lower-arm switching element off when the DC power supply is reversely connected. The characteristics of the voltage divider and the HEMT allow no current to flow through the inverter when the DC power supply is reversely connected. Thus, measures can be taken for the reverse connection of the DC power supply without the need to insert a mechanical relay, a diode, or an FET configured to prevent flow of current when the DC power supply is reversely connected.

In the first configuration, the voltage divider may be configured to supply different partial voltages to the gate and the drain of the lower-arm switching element such that both a voltage between the gate and the drain of the lower-arm switching element and a voltage between the gate and a source of the lower-arm switching element are equal to or lower than a threshold voltage for the lower-arm switching element when the DC power supply is reversely connected such that the positive electrode of the DC power supply is connected to the negative electrode terminal, while the negative electrode of the DC power supply is connected to the positive electrode terminal (second configuration). Consequently, the lower-arm switching element can be turned off when the DC power supply is reversely connected.

The voltage divider may include a first voltage divider that supplies a first partial voltage to the gate of the lower-arm switching element and a second voltage divider that supplies a second partial voltage to the drain of the lower-arm switching element (third configuration). This facilitates adjustment of the partial voltage supplied to the gate and the partial voltage supplied to the drain. For example, circuit constants for the first voltage divider and the second voltage divider may be set to make a first voltage lower than a second voltage when the DC power supply is reversely connected.

In any one of the first to third configurations, the voltage divider may include a Zener diode connected between the negative electrode terminal and the gate of the lower-arm switching element or between the negative electrode terminal and the drain of the lower-arm switching element. In this case, a direction from the positive electrode terminal toward the negative electrode terminal may correspond to a forward direction of the Zener diode (fourth configuration). The Zener diode allows a partial voltage that is lower than a supply voltage by a given amount to be supplied to the gate or the drain of the lower-arm switching element through the negative electrode terminal when the DC power supply is reversely connected. Thus, the voltage divider can be easily designed.

In any one of the first to fourth configurations, the voltage divider may include a diode for which a direction from the negative electrode terminal toward the positive electrode terminal is the forward direction (fifth configuration). This enables a reduction in a possible adverse effect of the voltage divider on a normal operation performed by the inverter when the DC power supply is normally connected.

An embodiment of the invention may be a motor control apparatus including the inverter in any one of the first to fifth configurations (sixth configuration). In the motor control apparatus in the sixth configuration, a point between the upper-arm switching element and the lower-arm switching element is connected to the motor.

An embodiment of the invention may be a power steering system that applies a steering assist force to a steering mechanism in a vehicle (seventh configuration). The power steering system in the seventh configuration includes the motor control apparatus in the sixth configuration and the motor controlled by the motor control apparatus to apply the steering assist force to the steering mechanism.

The embodiment will be described below with reference to the drawings. The same components and corresponding components in the drawings are denoted by the same reference numerals. The same descriptions will not be repeated. In the drawings, the components may be simplified or some of the components may be omitted for convenience of description.

Figure 1:
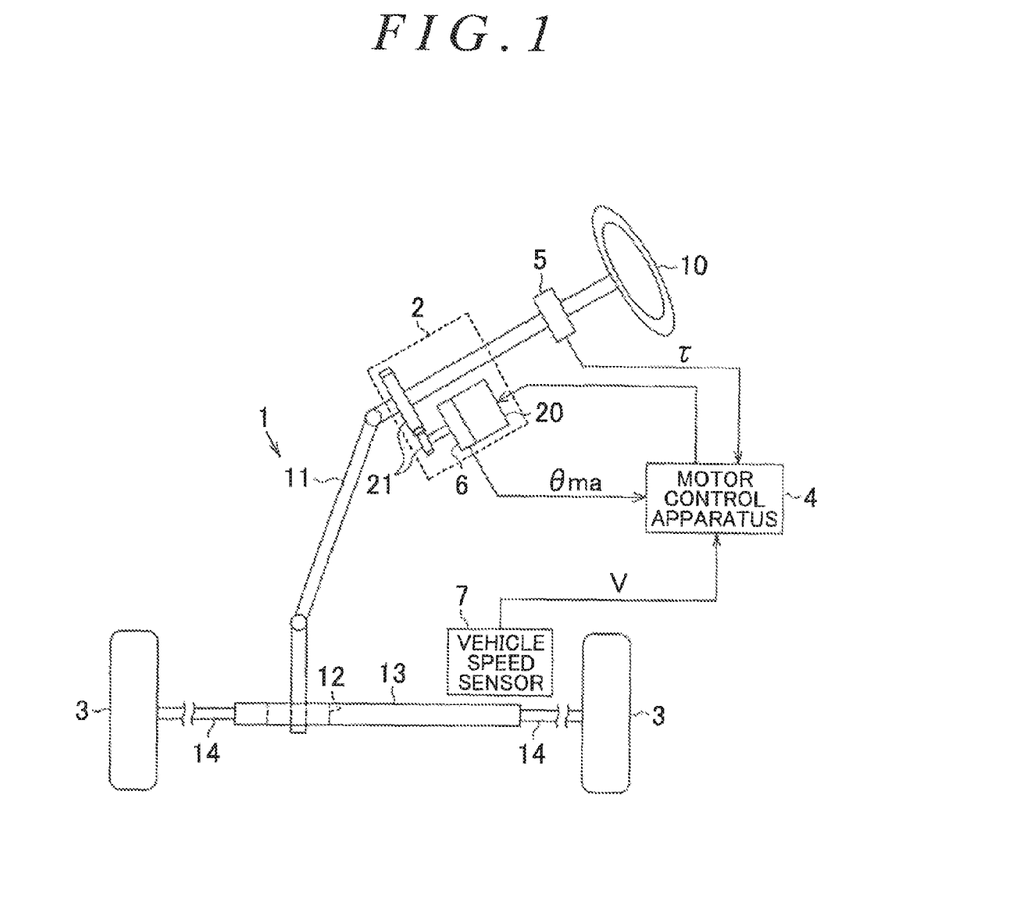
FIG. 1 is a block diagram depicting a configuration example of a power steering system.

FIG. 1 is a block diagram depicting a configuration example of a power steering system. The power steering system depicted in FIG. 1 includes a steering mechanism 1 that performs a steering operation on steered wheels 3 based on a driver's operation of a steering wheel 10 and an assist mechanism 2 that assists the driver's steering operation.

The steering mechanism 1 includes a steering shaft 11 serving as a rotating shaft of the steering wheel 10 and a rack shaft 13 coupled to a lower end of the steering shaft 11 via a rack-and-pinion mechanism 12. Tie rods 14 are coupled to opposite ends of the rack shaft 13. The steered wheels 3 are coupled to the respective tie rods 14. In the steering mechanism 1, when the steering shaft 11 rotates in conjunction with the driver's operation of the steering wheel 10, the rotary motion of the steering shaft 11 is converted into an axial reciprocating linear motion of the rack shaft 13 via the rack-and-pinion mechanism 12. The reciprocating linear motion of the rack shaft 13 is transmitted to the steered wheels 3 via the tie rods 14 coupled to the opposite ends of the rack shaft 13. This varies the steered angle of the steered wheels 3 and thus a traveling direction of the vehicle.

The assist mechanism 2 includes a motor 20 that applies an assist torque to the steering shaft 11. The motor 20 is a three-phase brushless motor. Rotation of the motor 20 is transmitted to the steering shaft 11 via a gear mechanism 21 to apply a motor torque to the steering shaft 11. Consequently, the steering operation is assisted.

The power steering system is provided with various sensors that detect manipulated variables for the steering wheel 10 and state variables for the vehicle. For example, the steering shaft 11 is provided with a torque sensor (torque detection unit) 5 that detects a torque (steering torque) τ applied to the steering shaft 11 during the driver's steering operation. The motor 20 is provided with a rotation angle sensor 6 that detects a rotation angle (electrical angle) θma of the motor 20. The vehicle is provided with a vehicle speed sensor 7 that detects a vehicle speed V of the vehicle. Outputs from the sensors 5 to 7 are loaded into a motor control apparatus 4. The motor control apparatus 4 controls and drives the motor 20 based on the outputs from the sensors 5 to 7.

Figure 2:
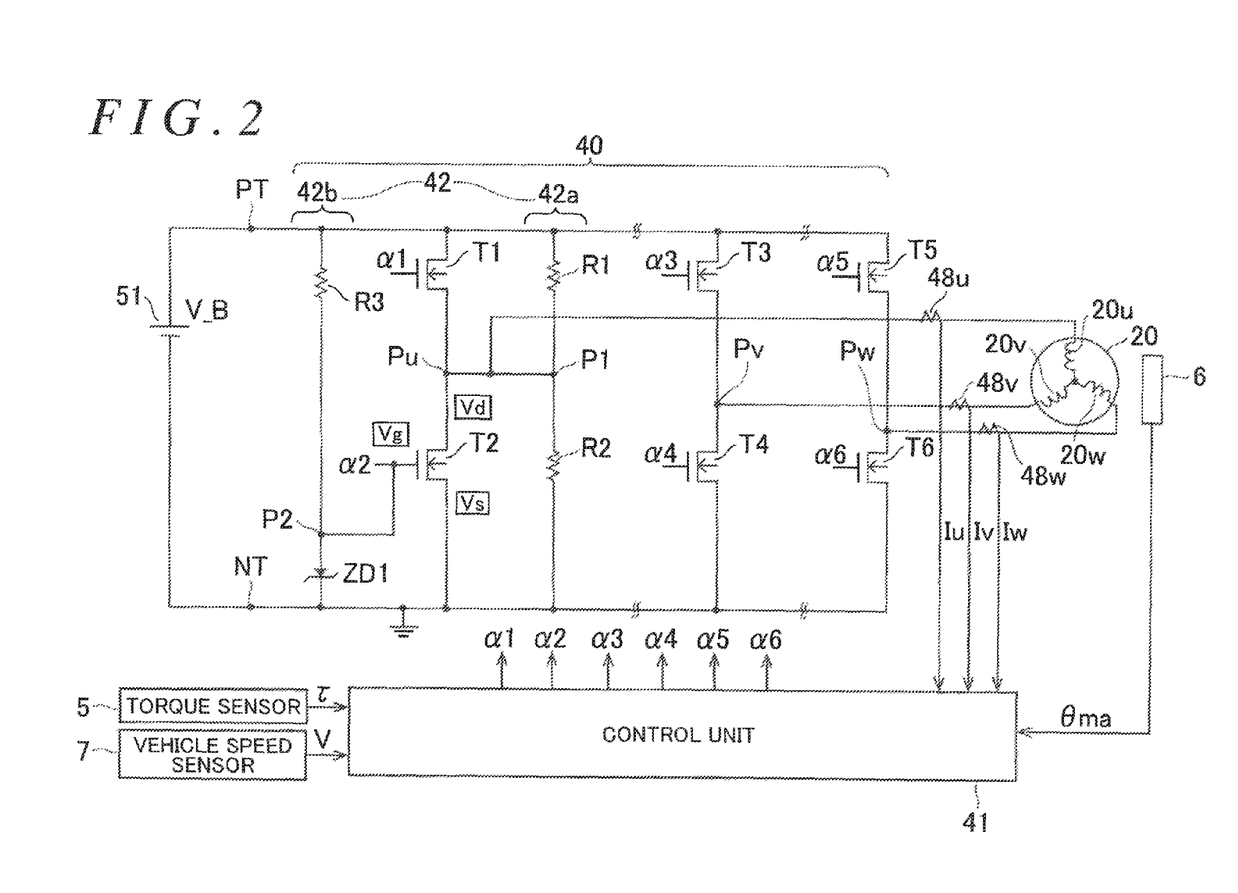
FIG. 2 is a block diagram depicting a configuration example of a motor control apparatus.

FIG. 2 is a block diagram depicting a configuration example of the motor control apparatus 4. The motor control apparatus 4 includes an inverter 40 and a control unit 41.

The inverter 40 is a driving circuit that supplies a three-phase AC voltage to the motor 20. The inverter 40 is connected to a positive electrode terminal PT and a negative electrode terminal NT. A positive electrode of a DC power supply 51 is connected to the positive electrode terminal PT. A negative electrode of the DC power supply 51 is connected to the negative electrode terminal NT. The positive electrode terminal PT is a component to which the positive electrode of the DC power supply 51 is to be connected. The negative electrode terminal NT is a component to which the negative electrode of the DC power supply 51 is to be connected. The present embodiment is configured such that what is called reverse connection may occur in which the negative electrode of the DC power supply 51 may erroneously be connected to the positive electrode terminal PT, while the positive electrode of the DC power supply 51 may erroneously be connected to the negative electrode terminal NT. In such a configuration, for example, the DC power supply 51 is a replaceable battery.

The inverter 40 includes upper-arm switching elements T1, T3, T5 and lower-arm switching elements T2, T4, T6 connected between the positive electrode terminal PT and the negative electrode terminal NT. The upper-arm switching elements T1, T3, T5 are connected to the positive electrode terminal PT side, and the lower-arm switching elements T2, T4, T6 are connected to the negative electrode terminal NT side. In the example illustrated in FIG. 2, the negative electrode terminal NT is connected to a ground terminal.

The upper-arm switching elements T1, T3, T5 and the lower-arm switching elements T2, T4, T6 corresponding to the upper-arm switching elements T1, T3, T5, respectively, form bridge circuits corresponding to an U phase, a V phase, and a W phase, respectively. The upper-arm switching elements T1, T3, T5 may also be referred to as high-side transistors, and the lower-arm switching elements T2, T4, T6 may also be referred to as low-side transistors.

Each of the upper-arm switching elements T1, T3, T5 is connected in series with the corresponding one of the lower-arm switching elements T2, T4, T6. That is, pairs of switching elements connected together in series (the pairs each of the upper-arm switching element and the lower-arm switching element) are connected together in parallel between the positive electrode terminal PT and the negative electrode terminal NT such that the number of the pairs is equal to the number of the phases. Nodes (that may also be referred to as middle points or connection points) Pu, Pv, Pw between the upper-arm switching elements T1, T3, T5 and the lower-arm switching elements T2, T4, T6 are connected to phase coils 20u, 20v, 20w, respectively, of the motor 20 as output terminals for the U phase, the V phase, and the W phase.

In the pair of the switching elements T1 and T2, a drain of the upper-arm switching element T1 is connected to the positive electrode terminal PT. A gate of the upper-arm switching element T1 is connected to an input terminal for a control signal α1 from the control unit 41. A source of the upper-arm switching element T1 is connected to a drain of the lower-arm switching element T2 and to the coil 20u of the motor 20. A gate of the lower-arm switching element T2 is connected to an input terminal for a control signal α2 from the control unit 41. A source of the lower-arm switching element T2 is connected to the negative electrode terminal NT (ground). The other switching element pairs (T3 and T4; T5 and T6) are similarly connected.

As described above, in the present embodiment, electrodes of the lower-arm switching elements T2, T4, T6 that are connected to the upper-arm switching elements T1, T3, T5, respectively, are drains. Electrodes of the lower-arm switching elements T2, T4, T6 that are connected to the negative electrode terminal NT are sources.

Voltages corresponding to the control signals α1 to α6 from the control unit 41 are applied to the gates of the switching elements T1 to T6, respectively, of the inverter 40. Although not depicted in FIG. 2, a driver may be provided which applies voltages corresponding to the control signals α1 to α6 to the gates of the switching elements T1 to T6, respectively. For example, a first voltage or a second voltage is selectively applied to the gates of the switching elements T1 to T6. The second voltage is higher than the first voltage. When voltages of the gates of the switching elements T1 to T6 are each switched between the first voltage and the second voltage, the switching elements T1 to T6 are switched on and off. In this case, each of the switching elements T1 to T6 may be provided with a driver (not depicted) that switches a voltage applied to the gate of each of the switching elements T1 to T6 between the first voltage and the second voltage.

Figure 3:
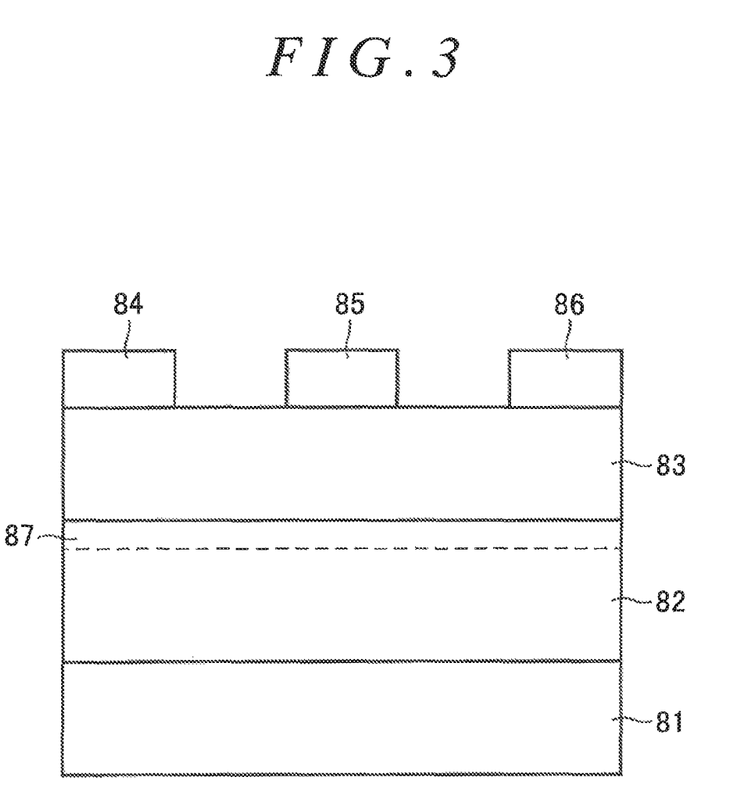
FIG. 3 is a sectional view depicting a configuration example of an HEMT.

Each of the lower-arm switching elements T2, T4, T6 may include an HEMT. FIG. 3 is a sectional view depicting a configuration example of the HEMT. As depicted in FIG. 3, the HEMT includes an electron transit layer (channel layer) 82 and an electron supply layer (barrier layer) 83 laminated on a substrate 81 in order, and a source electrode 84, a gate electrode 85, and a drain electrode 86 provided on the electron supply layer 83 away from one another. The electron transit layer 82 is formed of, for example, GaN or GaAs. The electron supply layer 83 is formed of, for example, i-type AlGaN (undoped) or n-type AlGaAs. A two-dimensional electron gas (2 DEG) 87 is formed near an interface between the electron transit layer 82 and the electron supply layer 83. The two-dimensional electron gas 87 layer is formed based on a difference in level between semiconductors joined together. The source electrode 84 and the drain electrode 86 are formed in ohmic contact with the two-dimensional electron gas. On the electron supply layer 83, a gate electrode 85 is formed between the source electrode 84 and the drain electrode 86. In the example illustrated in FIG. 3, a set of the source electrode 84 and semiconductor layers under the source electrode 84 and a set of the drain electrode 86 and semiconductor layers under the drain electrode 86 are arranged substantially laterally symmetrically with respect to an axis extending through the gate electrode 85 in a lamination direction. The HEMT depicted in FIG. 3 has no pn junction and thus no parasitic diode.

As described above, the HEMT has the two-dimensional electron gas layer formed by heterojunction of compound semiconductors. That is, the HEMT is structured to pass a current through the two-dimensional electron gas layer formed by heterojunction of compound semiconductors. In general, the HEMT is formed of a semiconductor containing a group III element and a group V element. The semiconductor contained in the HEMT is, for example, GaN, GaAs, InP, or SiGe.

The structure of the HEMT is not limited to the example illustrated in FIG. 3. Another layer may be added to the configuration in FIG. 3. For example, a buffer layer may be provided between the substrate 81 and the electron transit layer 82. A spacer layer may also be provided between the electron transit layer 82 and the electron supply layer 83. A gap layer may also be provided between the electron supply layer 83 and each of the source electrode 84, the gate electrode 85, and the drain electrode 86. An insulating layer may also be provided between the gate electrode 85 and the electron supply layer 83. In the invention, any transistor structured to involve no parasitic diode may be considered to be equivalent to the HEMT even if the transistor has a structure different from the above-described HEMT structure.

The upper-arm switching elements T1, T3, T5 may each include an HEMT like the lower-arm switching elements T2, T4, T6. The upper-arm switching elements T1, T3, T5 and the lower-arm switching elements T2, T4, T6 may be of a normally on type or a normally off type.

As seen in FIG. 2 again, the inverter 40 includes a voltage divider 42 connected between the positive electrode terminal PT and the negative electrode terminal NT. The voltage divider 42 supplies partial voltages of the voltage between the positive electrode terminal PT and the negative electrode terminal NT to the gate and the drain, respectively, of the lower-arm switching element T2. That is, the voltage divider 42 generates partial voltages into which the voltage between the positive electrode terminal PT and the negative electrode terminal NT is divided. When the DC power supply 51 is reversely connected, the voltage divider 42 applies different partial voltages to the gate and the drain, respectively, of the lower-arm switching element T2. The partial voltages from the voltage divider are set to turn the lower-arm switching element T2 off when the DC power supply 51 is reversely connected.

In the example illustrated in FIG. 2, the voltage divider 42 has a first voltage divider 42a and a second voltage divider 42b. The first voltage divider 42a generates a first partial voltage at a node P1 on a line connecting the positive electrode terminal PT and the negative electrode terminal NT together. The node P1 (first partial voltage node) at which the first partial voltage is generated is connected to a node Pu, that is, the drain of the lower-arm switching element T2. Consequently, the first partial voltage is supplied to the drain of the lower-arm switching element T2. The first voltage divider 42a includes a plurality of resistors R1, R2 connected in series between the positive electrode terminal PT and the negative electrode terminal NT. The first partial voltage is generated at the node P1 between the resistors R1, R2.

The second voltage divider 42b generates a second partial voltage at a node P2 on a line connecting the positive electrode terminal PT and the negative electrode terminal NT together. The node P2 (second partial voltage node) at which the second partial voltage is generated is connected to the gate of the lower-arm switching element T2. Consequently, the second partial voltage is supplied to the gate of the lower-arm switching element T2. The second voltage divider 42b includes a resistor R3 and a Zener diode ZD1 connected between the positive electrode terminal PT and the negative electrode terminal NT. The second partial voltage is generated at the node P2 between the resistor R3 and the Zener diode ZD1. The resistor R3 is connected between the positive electrode terminal PT and the node P2. The Zener diode ZD1 is connected between the node P2 and the negative electrode terminal NT. The Zener diode ZD1 is connected such that a direction from the positive electrode terminal PT toward the negative electrode terminal NT corresponds to a forward direction.

The first partial voltage and the second partial voltage are set to turn the lower-arm switching element T2 off when the DC power supply 51 is reversely connected. The first partial voltage can be determined chiefly by circuit constants (resistance values) of the elements (resistors R1, R2) of the first voltage divider 42a. The second partial voltage can be determined chiefly by a circuit constant (Zener voltage) of the element (Zener diode ZD1) of the second voltage divider 42b. In the example illustrated in FIG. 2, the resistance values of the resistors R1, R2 and the Zener voltage of the Zener diode ZD1 are set to turn the lower-arm switching element T2 off when the DC power supply 51 is reversely connected.

For example, the first partial voltage and the second partial voltage may be set such that both a voltage (Vg−Vd) between the gate and the drain of the lower-arm switching element T2 and a voltage (Vg−Vs) between the gate and the source of the lower-arm switching element T2 are equal to or lower than a threshold voltage Vth for the lower-arm switching element T2 when the DC power supply 51 is reversely connected. That is, the first partial voltage and the second partial voltage may be set to make the voltage of the gate of the lower-arm switching element T2 lower than both the voltage of the drain and the voltage of the source. A specific example will be described below.

When the DC power supply 51 is reversely connected, the voltage Vs of the source of the lower-arm switching element T2 is equal to a voltage V_B of the DC power supply 51. When the DC power supply 51 is reversely connected, the voltage Vg of the gate of the lower-arm switching element T2 is equal to the voltage V_B of the DC power supply 51 minus a Zener voltage Vzener of the Zener diode ZD1, that is, Vg=V_B−Vzener. When the DC power supply 51 is reversely connected, the voltage Vd of the drain of the lower-arm switching element T2 is determined by the partial voltages based on the resistor R1 and the resistor R2, that is, Vd=V_B×r1/(r1+r2). In the equation, the resistance value of the resistor R1 is denoted by r1, and the resistance value of the resistor R2 is denoted by r2.

The lower-arm switching element T2 is an HEMT, and thus, even when the DC power supply 51 is reversely connected, the lower-arm switching element T2 functions as in the case of normal connection. Thus, if (Vd−Vg)<Vth and (Vs−Vg)<Vth, the lower-arm switching element T2 is turned off. The resistance values r1, r2 of the resistors R1, R2 and the Zener voltage Vzener of the Zener diode ZD1 are set such that (Vd−Vg)<Vth and (Vs−Vg)<Vth when the DC power supply 51 is reversely connected. This allows setting of a condition under which the lower-arm switching element T2 is turned off when the DC power supply 51 is reversely connected. As a result, when the DC power supply 51 is reversely connected, the lower-arm switching element T2 is turned off, allowing no reverse connection current to flow.

Resistance values r1, r2, r3 that are constants for resistors R1, R2, R3 are preferably set to a sufficiently large value to the extent that the operation in the normal state (the operation performed while the DC power supply 51 is normally connected) is not affected. This enables a reduction in a possible adverse effect of the voltage divider 42 on the operation of the inverter 40 while the DC power supply 51 is normally connected.

As described above, when the DC power supply 51 is reversely connected, the voltage of the DC power supply 51 is divided into partial voltages, and the partial voltages are supplied to the lower-arm switching element T2 to turn the lower-arm switching element T2 off. The voltage divider 42 is connected in parallel with the upper-arm switching element T1 and the lower-arm switching element T2 between the positive electrode terminal PT and the negative electrode terminal NT, and connected to the gate and the drain of the lower-arm switching element T2.

Although not depicted in FIG. 2, the voltage divider 42 is provided not only for the arm pair of the upper-arm switching element T1 and the lower-arm switching element T2 but also for the other arm pairs. That is, the voltage divider 42 is provided for the arm pair for each phase. Specifically, the voltage divider 42 is similarly provided for the upper-arm switching element T3 and the lower-arm switching element T4 and for the upper-arm switching element T5 and the lower-arm switching element T6. More specifically, the inverter is provided with a first voltage divider that supplies a first partial voltage to the node Pv and a second voltage divider that supplies a second partial voltage to the gate of the lower-arm switching element T4. The inverter is also provided with a first voltage divider that supplies a first partial voltage to the node Pw and a second voltage divider that supplies a second partial voltage to the gate of the lower-arm switching element T6.

The switching elements T1 to T6 are switched to convert DC power from the DC power supply 51 (power supply voltage V_B) into three-phase (U phase, V phase, W phase) AC voltages. The resultant three-phase AC voltages are supplied to the phase coils 20u to 20w of the motor 20 via the nodes Pu, Pv, Pw to rotate the motor 20.

Specifically, the control unit 41 drives the inverter 40 based on pulse width modulation (PWM) by outputting PWM driving signals to the switching elements T1 to T6 as control signals. On-off actions (electric conduction states) of the switching element pairs (T1 and T2; T3 and T4; T5 and T6) corresponding to the U, V, and W phases, respectively, are controlled by pairs of PWM driving signals (α1 and α2; α3 and α4; α5 and α6) corresponding to the U, V, and W phases, respectively. The paired PWM driving signals for each phase are in an inverse relation with each other. Consequently, voltages obtained at the nodes Pu, Pv, Pw for the respective phases are applied to the motor 20 as a U-phase voltage, a V-phase voltage, and a W-phase voltage, respectively. Thus, the U-phase current, the V-phase current, and the W-phase current are supplied to the motor 20.

Feed lines between the motor 20 and each of the nodes Pu, Pv, Pw are provided with current sensors 48u to 48w that detect phase currents Iu to Iw, respectively. Outputs from the current sensors 48u to 48w are loaded into the control unit 41. The control unit 41 also loads the steering torque τ from the torque sensor 5, the vehicle speed V from the vehicle speed sensor 7, and the rotation angle θma from the rotation angle sensor 6.

The control unit 41 receives the phase current values Iu to Iw, the steering torque τ, the vehicle speed V, and the rotation angle θma of the motor to generate control signals based on these data. For example, the control unit 41 generates voltage command values Vu*, Vv*, Vw* for the respective phases of the motor 20 based on the steering torque τ, the vehicle speed V, the rotation angle θma, and the phase current values Iu to Iw. The control unit 41 generates PWM driving signals α1, α3, α5 and negate signals α2, α4, α6 therefor based on the voltage command values Vu*, Vv*, Vw*.

In a specific example, the control unit 41 determines a target value It for a current to be passed to the motor 20 based on the steering torque T and the vehicle speed V, and calculates a difference between a q-axis component of the target value It for the current and a q-axis component of a current detection value determined from the phase current values Iu to Iw and a difference between a d-axis component of the target value It for the current and a d-axis component of the current detection value determined from the phase current values Iu to Iw. To cancel the differences, the control unit 41 calculates voltages to be applied to the motor 20 as the voltage command values Vu*, Vv*, Vw*. Consequently, the control unit 41 drives the motor 20 based on current feedback control.

Unlike in the above-described specific example, the control unit 41 may calculate the voltage command values Vu*, Vv*, Vw* in accordance with a motor circuit equation based on the target value It and the rotation angle θma of the motor 20. Parameters used for the motor circuit equation are modified based on the current detection value Im. In this case, the current detection value Im may be detected, for example, based on voltages at opposite ends of a resistor for current detection provided in the inverter 40 depicted in FIG. 2. The resistor for current detection may be inserted between the ground (the negative electrode of the DC power supply) and the lower-arm switching elements T2, T4, T6.

The control unit 41 may also estimate the rotation angle θm of the motor 20 using voltage detection values for the respective phases and calculate the voltage command values Vu*, Vv*, Vw* using the rotation angle θm. The control unit 41 may also detect abnormality in the inverter 40 or any of the switching elements T1 to T6 based on the voltage detection values for the respective phases. In this case, the inverter 40 is provided with circuits that detect the respective phase voltages.

Figure 4:
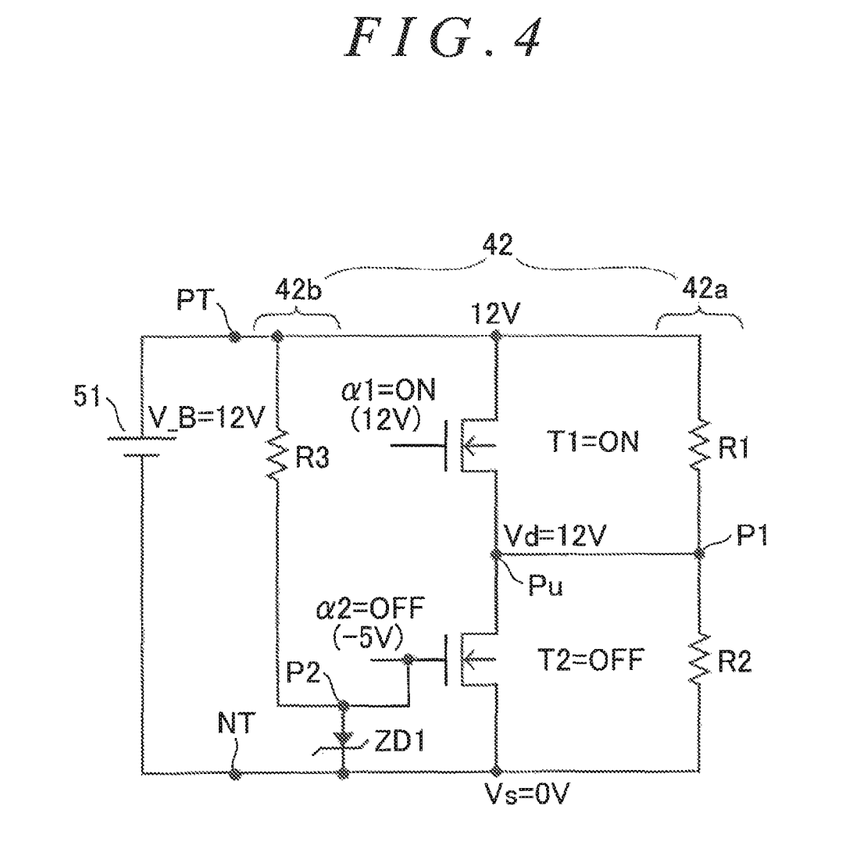
FIG. 4 is a diagram illustrating an operation example of an inverter in a case where a DC power supply is normally connected.
Figure 5:
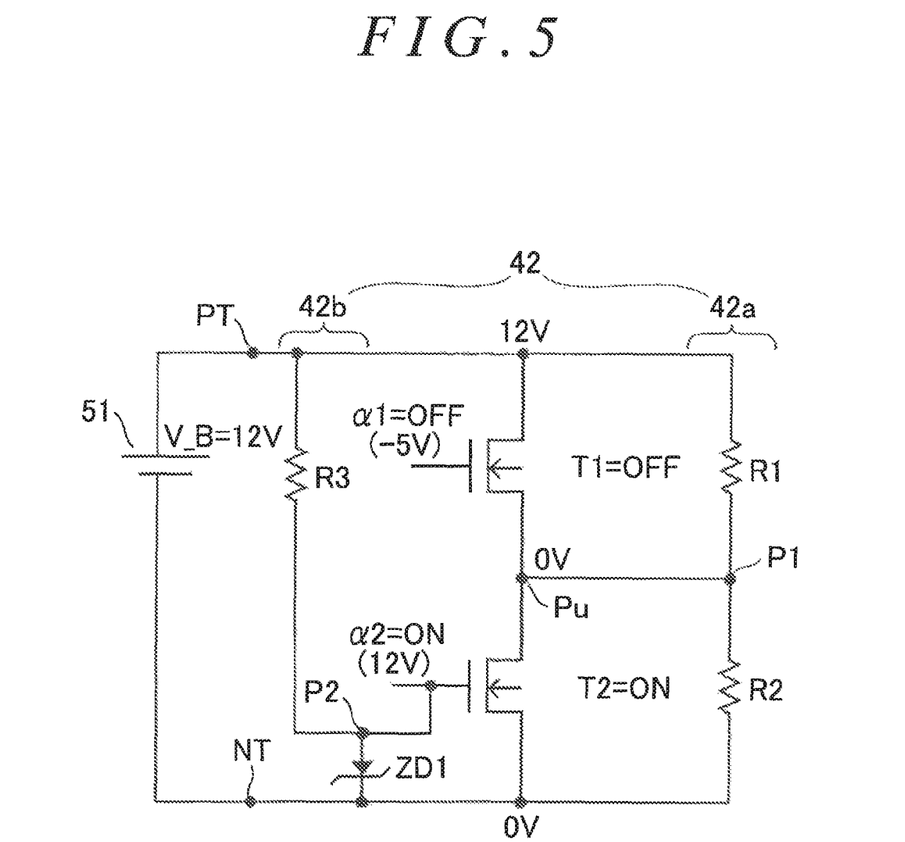
FIG. 5 is a diagram illustrating another operation example of an inverter in a case where the DC power supply is normally connected.
Figure 6:
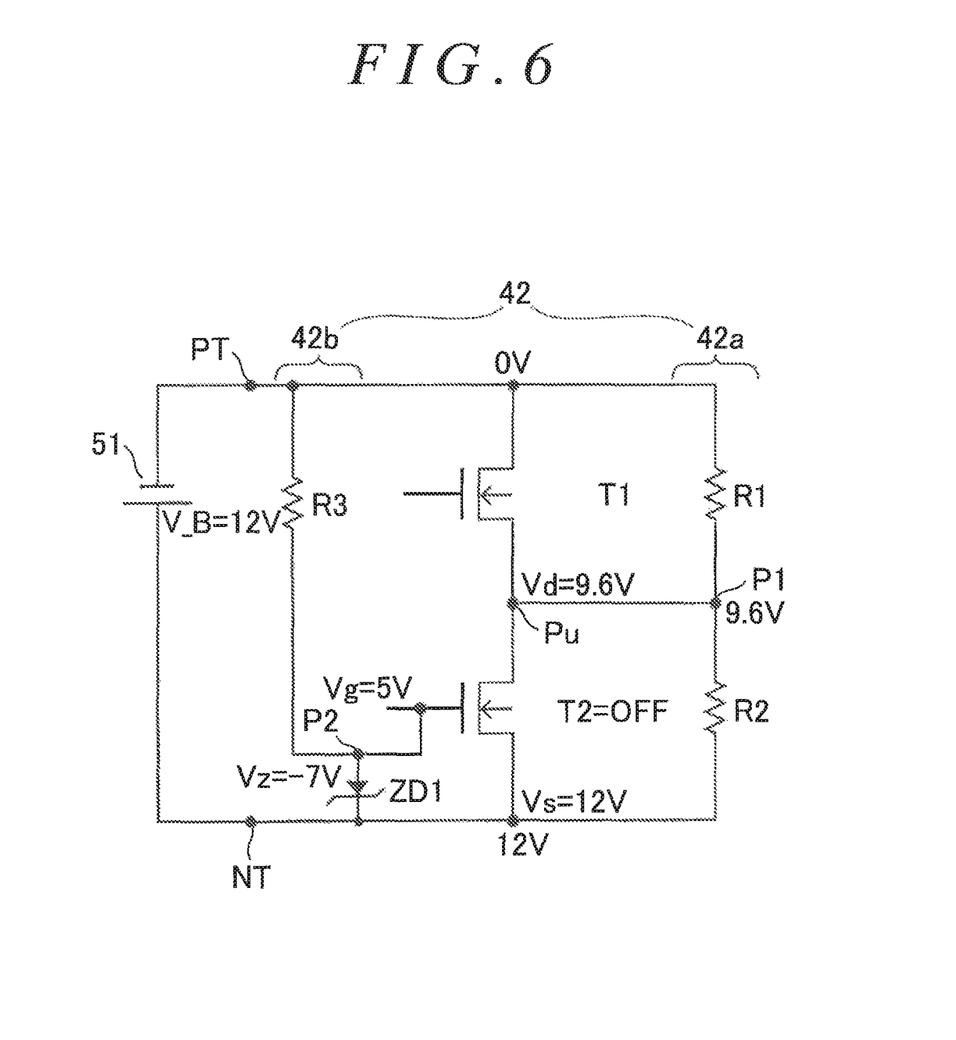
FIG. 6 is a diagram illustrating an operation example of an inverter in a case where the DC power supply is reversely connected.

Now, operation examples of the inverter 40 will be described. FIGS. 4 to 6 are diagrams depicting a configuration of a part of FIG. 2. FIGS. 4 to 6 depict the electric conduction states of the respective operations and gate voltages of the switching elements T1, T2, the voltages of the nodes Pu, P1, P2, and the voltages of the positive electrode terminal PT and the negative electrode terminal NT. These voltage values are obtained when the ground voltage is 0 V.

Examples illustrated in FIGS. 4 to 6 are operation examples under the following conditions. The power supply voltage V_B of the DC power supply 51 is 12 V, and the Zener voltage Vzener of the Zener diode ZD1 in the second voltage divider 42b is −7 V. The ratio of the resistance value r1 of the resistor R1 to the resistance value r2 of the resistor R2 in the first voltage divider 42a is 4:1. The upper and lower-arm switching elements T1, T2 are normally on transistors. The threshold voltage Vth for the lower-arm switching element T2 is Vth=−3 V.

FIG. 4 illustrates that with the positive electrode of the DC power supply 51 connected to the positive electrode terminal PT and with the negative electrode of the DC power supply 51 connected to the negative electrode terminal (normal connection), the upper-arm switching element T1 is on, while the lower-arm switching element T2 is off. In this case, the control unit 41 outputs the control signal α1 indicating an on action to the upper-arm switching element T1 and also outputs the control signal α2 indicating an off action to the lower-arm switching element T2. Consequently, a driver (not depicted in the drawings) operating in accordance with the control signals α1, α2 applies an on voltage (12 V by way of example) to the gate of the upper-arm switching element T1 and applies an off voltage (−5 V by way of example) to the gate of the lower-arm switching element T2. The voltages of the positive electrode terminal PT and the node Pu are equal to the voltage V_B of the DC power supply 51=12 V. The voltage of the negative electrode terminal NT is 0 V.

FIG. 5 illustrates that with the DC power supply 51 normally connected, the upper-arm switching element T1 is off, while the lower-arm switching element T2 is on. In this case, the control unit 41 outputs the control signal α1 indicating an off action to the upper-arm switching element T1 and also outputs the control signal α2 indicating an on action to the lower-arm switching element T2. Consequently, the off voltage (−5 V by way of example) is applied to the gate of the upper-arm switching element T1. The on voltage (12 V by way of example) is applied to the gate of the lower-arm switching element T2. The voltage of the positive electrode terminal PT is equal to the voltage V_B of the DC power supply 51=12 V. The voltage of the node Pu and the voltage of the negative electrode terminal NT are 0 V.

In the examples illustrated in FIG. 4 and FIG. 5, currents flowing through the voltage dividers 42a, 42b can be reduced by setting the resistors R1, R2, R3 to sufficiently large resistance values. Consequently, while the DC power supply 51 is normally connected, the adverse effect of the voltage dividers 42a, 42b on the operation of the inverter 40 can be reduced to a negligibly small magnitude. In the present example, the resistance values of the resistors R1 and R2 determine the amount of current constantly flowing to the ground GND from a node to which a voltage in an upper stage of the inverter is applied. Since the resistor R3 is connected to the gate of the lower-arm switching element T2, the resistance value of the resistor R3 determines the amount of current flowing from the positive electrode terminal PT into the gate of the lower-arm switching element T2.

FIG. 6 illustrates a state where the DC power supply 51 is reversely connected. In this case, the voltage of the negative electrode terminal NT is equal to the voltage V_B of the DC power supply 51=12 V, and the voltage of the positive electrode terminal PT is 0 V. The voltage Vs of the source of the lower-arm switching element T2 is equal to the voltage of the negative electrode terminal NT, that is, Vs=12 V. The voltage Vg of the gate is a voltage (second voltage) different from the voltage of the negative electrode terminal NT such that the difference is equal to the Zener voltage Vzener=−7 V, that is, Vg=5 V. The voltage Vd of the drain of the lower-arm switching element T2 is equal to the voltage (first voltage) of the node P1 between the resistors R1, R2, that is, Vd=V_B×r1/(r1+r2)=12×4/5=9.6 V.

In this case, the voltage of the gate of the lower-arm switching element T2 is lower than both voltages of the drain and the source of the lower-arm switching element T2. Both the voltage (Vg−Vd) between the gate and the drain of the lower-arm switching element T2 and the voltage (Vg−Vs) between the gate and the source thereof are lower than the threshold voltage Vth for the lower-arm switching element T2. That is, the voltage between the gate and the drain is Vg−Vd=5−9.6=−4.6<Vth=−3. The voltage between the gate and the source is Vg−Vs=5−12=−7<Vth=−3. Consequently, the lower-arm switching element T2 is turned off. Thus, no reverse connection current flows through the inverter 40.

As described above, in the present embodiment, the lower-arm switching element T2 operates as a lower arm while the DC power supply 51 is normally connected, and operates as a switch that prevents flow of a reverse connection current while the DC power supply 51 is reversely connected. This eliminates the need to provide a switching element, a diode, or the like configured to prevent flow of a reverse connection current in addition to switching elements operating as arms of the inverter 40. That is, measures can be taken against the reverse connection of the DC power supply without the need to insert a mechanical relay, a diode, an FET, or the like configured to prevent flow of current while the DC power supply is reversely connected. The inverter 40 in the present embodiment reduces a resistance component of a current path compared to a configuration having an additional element allowing prevention of flow of a reverse connection current. This reduces losses to the apparatus, leading to improved efficiency. A heat sink mass is also reduced which results from reduced losses. The need to implement additional elements is eliminated, allowing the apparatus to be miniaturized.

The specific configuration of the voltage divider 42 is not limited to the example illustrated in FIG. 2. For example, in the configuration depicted in FIG. 2, the Zener diode ZD1 may be replaced with a resistor. The resistor R2 may also be replaced with a Zener diode.

In the voltage divider 42, a diode for which the direction from the negative electrode terminal NT toward the positive electrode terminal PT corresponds to the forward direction may be arranged at least at one position on the line connecting the positive electrode terminal PT and the negative electrode terminal NT. For example, in FIG. 2, such a diode may be inserted into at least one of four zones including a zone between the positive electrode terminal PT and the node P1 in the first voltage divider 42a, a zone between the node P1 and the negative electrode terminal NT in the first voltage divider 42a, a zone between the positive electrode terminal PT and the node P2 in the second voltage divider 42b, and a zone between the node P2 and the negative electrode terminal NT in the second voltage divider 42b.

Figure 7:
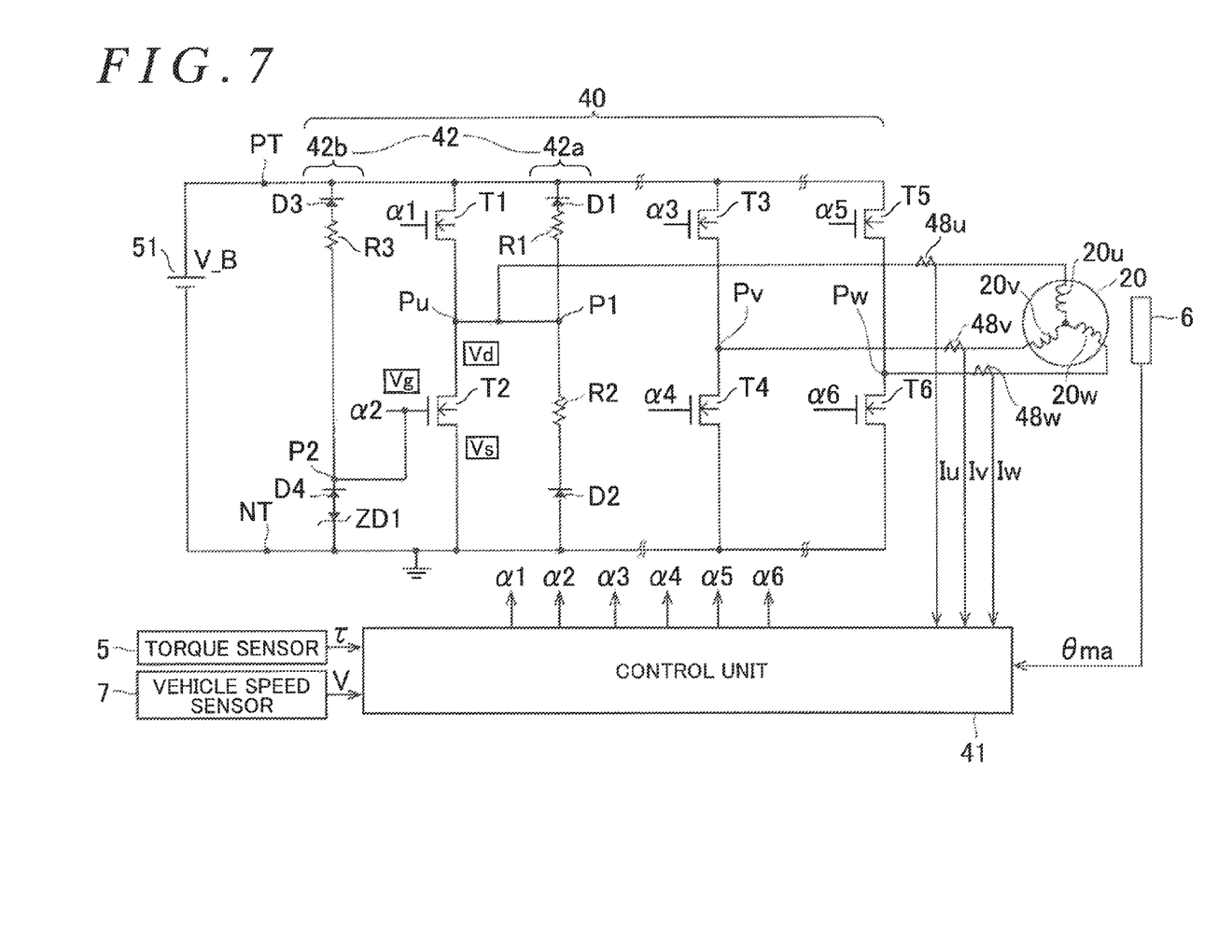
FIG. 7 is a diagram depicting a configuration example in which a diode is inserted into a voltage divider depicted in FIG. 2.

FIG. 7 is a diagram depicting a configuration example in which a diode is inserted into the voltage divider 42. The example illustrated in FIG. 7 corresponds to the configuration illustrated in FIG. 2 and in which diodes D1 to D4 are inserted into the above-described four zones. The diodes D1 to D4 are all connected such that the direction from the positive electrode terminal PT toward the negative electrode terminal NT corresponds to a backward direction. Thus, while the DC power supply 51 is normally connected, no current flows through the voltage divider 42. Consequently, the voltage divider 42 is less likely to affect the operation of the inverter 40 in the normal state.

In the example illustrated in FIG. 2, the voltage divider 42 has the first voltage divider 42a and the second voltage divider 42b connected together in parallel between the positive electrode terminal PT and the negative electrode terminal NT. In contrast, the voltage divider may be configured by providing a first partial voltage node and a second partial voltage node on one line connecting the positive electrode terminal PT and the negative electrode terminal NT together.

Figure 8:
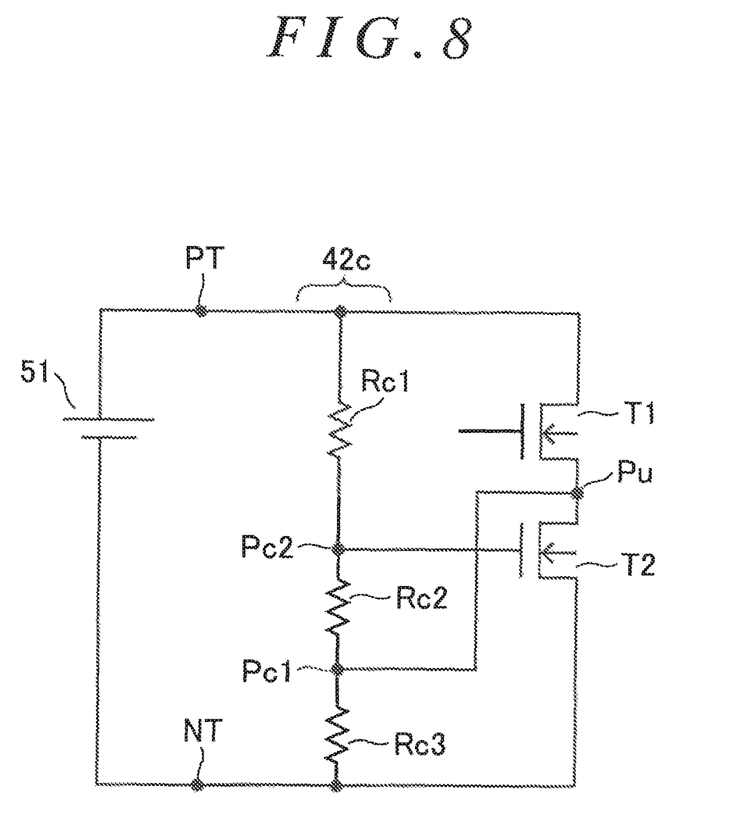
FIG. 8 is a diagram depicting a variation of the voltage divider.

FIG. 8 is a diagram depicting another variation of the voltage divider. In the example illustrated in FIG. 8, the voltage divider 42 includes three resistors Rc1, Rc2, Rc3 connected together in series between the positive electrode terminal PT and the negative electrode terminal NT. For nodes Pc1, Pc2 between the three resistors Rc1, Rc2, Rc3, the node Pc1 located closer to the negative electrode terminal NT is connected to the drain (node Pu) of the lower-arm switching element T2. For the nodes Pc1, Pc2 between the three resistors Rc1, Rc2, Rc3, the node Pc2 located closer to the positive electrode terminal PT is connected to the gate of the lower-arm switching element T2. A voltage generated at the node Pc1 is supplied to the drain of the lower-arm switching element T2 as a first partial voltage. A voltage generated at the node Pc2 is supplied to the gate of the lower-arm switching element T2 as a second partial voltage.

The resistance values of the resistors Rc1, Rc2, Rc3 are set to turn the lower-arm switching element T2 off when the DC power supply 51 is reversely connected. The resistance values of the resistors Rc1, Rc2, Rc3 are referred to as rc1, rc2, rc3. In this case, when the DC power supply 51 is reversely connected, the voltage Vs of the source of the switching element T2 is Vs=V_B, the drain voltage Vd of the lower-arm switching element T2 is Vd=V_B×(rc1+rc2)/(rc1+rc2+rc3), and the gate voltage Vg is Vg=V_B×rc1/(rc1+rc2+rc3). The resistance values rc1, rc2, rc3 may be set such that (Vd−Vg)<Vth and (Vs−Vg)<Vth when the DC power supply 51 is reversely connected.

The voltage divider depicted in FIG. 8 may be provided for any other arm (that is, one or both of the arms of the switching element pairs (T3 and T4; T5 and T6)). Alternatively, into the voltage divider 42c depicted in FIG. 8, a diode may be inserted for which the direction from the negative electrode terminal NT toward the positive electrode terminal PT corresponds to the forward direction. Alternatively, at least one of the resistors Rc2, Rc3 depicted in FIG. 8 may be replaced with a Zener diode. In this case, for the Zener diode, the direction from the positive electrode terminal PT toward the negative electrode terminal NT corresponds to the forward direction.

The inverter in the invention is not limited to the inverter used to control the motor. For example, the inverter in the invention may be applied to an inverter for a converter connected to a battery to convert DC power from the battery into an alternating current and to output the alternating current. The motor control apparatus is not limited to the motor control apparatus used for a power steering system. For example, the invention is applicable to consumer motors for home electric appliances, industrial motors, and any other motors.

The motor to which the motor control apparatus in the invention is directed is not limited to the three-phase brushless motor in the above-described examples. The invention is also applicable to motor control apparatuses configured to drive other types of motors, for example, brushless motors with more or less than three phases and motors with a brush.

The invention is not limited to the above-described column-assist electric power steering system, and is applicable to any other type of electric power steering system such as a pinion assist type or a rack assist type. The invention is also applicable to motor control apparatuses for any equipment other than the electric power steering system.

What is claimed is:

1. An inverter comprising:
   a positive electrode terminal and a negative electrode terminal to which a positive electrode and a negative electrode, respectively, of a DC power supply are connected;
   an upper-arm switching element and a lower-arm switching element connected in series between the positive electrode terminal and the negative electrode terminal; and
   a voltage divider connected between the positive electrode terminal and the negative electrode terminal to supply partial voltages of a voltage between the positive electrode terminal and the negative electrode terminal to a gate and a drain, respectively, of the lower-arm switching element; wherein
   the lower-arm switching element includes a high electron mobility transistor,
   in the voltage divider, the partial voltages are set to turn the lower-arm switching element off when the DC power supply is reversely connected in a manner that the positive electrode of the DC power supply is connected to the negative electrode terminal, while the negative electrode of the DC power supply is connected to the positive electrode terminal.

2. The inverter according to claim 1, wherein
   the voltage divider supplies different partial voltages to the gate and the drain, respectively, of the lower-arm switching element such that both a voltage between the gate and the drain of the lower-arm switching element and a voltage between the gate and a source of the lower-arm switching element are equal to or lower than a threshold voltage for the lower-arm switching element when the DC power supply is reversely connected in the manner that the positive electrode of the DC power supply is connected to the negative electrode terminal, while the negative electrode of the DC power supply is connected to the positive electrode terminal.

3. The inverter according to claim 1, wherein
   the voltage divider includes a first voltage divider that supplies a first partial voltage to the gate of the lower-arm switching element and a second voltage divider that supplies a second partial voltage to the drain of the lower-arm switching element.

4. The inverter according to claim 1, wherein
   the voltage divider includes a Zener diode connected between the negative electrode terminal and the gate of the lower-arm switching element or between the negative electrode terminal and the drain of the lower-arm switching element, and
   a direction from the positive electrode terminal toward the negative electrode terminal corresponds to a forward direction of the Zener diode.

5. The inverter according to claim 1, wherein
   the voltage divider includes a diode for which a direction from the negative electrode terminal toward the positive electrode terminal corresponds to a forward direction.

6. A motor control apparatus comprising:
   the inverter according to claim 1; wherein
   a point between the upper-arm switching element and the lower-arm switching element is connected to a motor.

7. A power steering system that applies a steering assist force to a steering mechanism in a vehicle, the power steering system comprising:
   the motor control apparatus according to claim 6; and
   the motor controlled by the motor control apparatus to apply the steering assist force to the steering mechanism.

* * * * *